United States Patent
Perçin et al.

(10) Patent No.: US 7,536,670 B2
(45) Date of Patent: May 19, 2009

(54) METHOD FOR VERIFYING AND CHOOSING LITHOGRAPHY MODEL

(75) Inventors: Gökhan Perçin, Los Gatos, CA (US); Ram Ramanujam, Santa Cruz, CA (US); Franz Xaver Zach, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 257 days.

(21) Appl. No.: 11/141,805

(22) Filed: May 31, 2005

(65) Prior Publication Data

US 2006/0282814 A1 Dec. 14, 2006

(51) Int. Cl.
*G06F 17/50* (2006.01)

(52) U.S. Cl. .................... 716/19; 716/4; 716/5; 716/21

(58) Field of Classification Search ............. 716/19–21, 716/4–5; 430/5, 22, 30; 382/144
See application file for complete search history.

(56) References Cited

U.S. PATENT DOCUMENTS

| | | | |
|---|---|---|---|
| 6,078,738 A | | 6/2000 | Garza et al. |
| 6,081,659 A | | 6/2000 | Garza et al. |
| 6,602,728 B1 * | | 8/2003 | Liebmann et al. ............. 438/16 |
| 6,673,638 B1 * | | 1/2004 | Bendik et al. ................. 438/14 |
| 6,768,958 B2 | | 7/2004 | Ivanovic et al. |
| 6,868,355 B2 | | 3/2005 | Ivanovic et al. |
| 2005/0196688 A1 * | | 9/2005 | Kim et al. ....................... 430/5 |
| 2005/0243299 A1 * | | 11/2005 | Spence et al. ................. 355/69 |
| 2005/0262467 A1 * | | 11/2005 | Croffie ......................... 716/19 |
| 2005/0268256 A1 * | | 12/2005 | Tsai et al. ....................... 716/4 |
| 2005/0273753 A1 * | | 12/2005 | Sezginer ...................... 716/21 |
| 2006/0073686 A1 * | | 4/2006 | Zach et al. ................... 438/551 |
| 2006/0085772 A1 * | | 4/2006 | Zhang ........................... 716/4 |
| 2006/0248497 A1 * | | 11/2006 | Huang et al. .................. 716/21 |
| 2006/0248498 A1 * | | 11/2006 | Sezginer et al. ............... 716/21 |

OTHER PUBLICATIONS

R.C. Gonzalez and R.E. Woods, "Image Segmentation",Chapter 7, pp. 416-429; "Recognition And Interpretation", Chapter 9, pp. 571-658, (Digital Image Processing), Addison-Wesley Publishing Co., 1992.
U.S. Appl. No. 10/266,922, filed Oct. 20, 2002, Laidig et al.
R.C. Gonzalez and R.E. Woods, "Digital Image Processing", Addison-Wesley Publishing Co., 1992, pp. 416-429, pp. 571-658.

* cited by examiner

*Primary Examiner*—Paul Dinh
(74) *Attorney, Agent, or Firm*—Sheppard Mullin Richter & Hampton LLP (57) ABSTRACT

A test mask with both verification structures and calibration structures is provided to enable the formation of an image of at least one verification structure and at least one calibration structure at a plurality of different test site locations under different dose and defocus conditions to allow the calibration structures to be measured and to obtain at least one computational model for optical proximity correction purposes.

21 Claims, 9 Drawing Sheets

METHOD FOR VERIFYING AND CHOOSING LITHOGRAPHY MODEL

RELATED APPLICATIONS

This application is related to U.S. patent application Ser. No.:11/141,803 Entitled, "METHOD FOR MEASURING AND VERIFYING STEPPER ILLUMINATION", filed May 31, 2005, now U.S. Pat. No. 7,224,437, which related application is incorporated herein by reference as though fully set forth and which is filed concurrently on the same date with the present application.

TECHNICAL FIELD

This invention relates to the general field of lithography. In particular, it relates to calibration and verification of computational models for lithography.

BACKGROUND

Computational models utilized in optical proximity correction processes must be accurate and precise. Accordingly, there is a need for a new and improved computational model verification process that improves the accuracy and precision of such computational models.

BRIEF SUMMARY OF THE INVENTION

The preferred embodiment of the present invention provides an apparatus and method where a test mask with both verification structures and calibration structures is provided to enable the formation of an image of at least one verification structure and at least one calibration structure at a plurality of different test site locations. The formation of the images is accomplished under different dose and defocus conditions to allow the calibration structures to be measured and to obtain a best and verified computational model selected from a plurality of calibrated computational models using the verification structures.

BRIEF DESCRIPTION OF THE DRAWINGS

The above mentioned features and steps of the invention and the manner of attaining them will become apparent, and the invention itself will be best understood by reference to the following description of the preferred embodiment(s) of the invention in conjunction with the accompanying drawings wherein.

DETAILED DESCRIPTION OF THE PREFERRED EMBODIMENTS

Systems and methods for calibrating and verifying computational models utilized with optical proximity correction are described. In this regard, the following description is presented to enable any person skilled in the art to make and use the invention. For purposes of explanation, specific nomenclature is set forth to provide a thorough understanding of the present invention. Descriptions of specific applications, methods, and apparatus are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
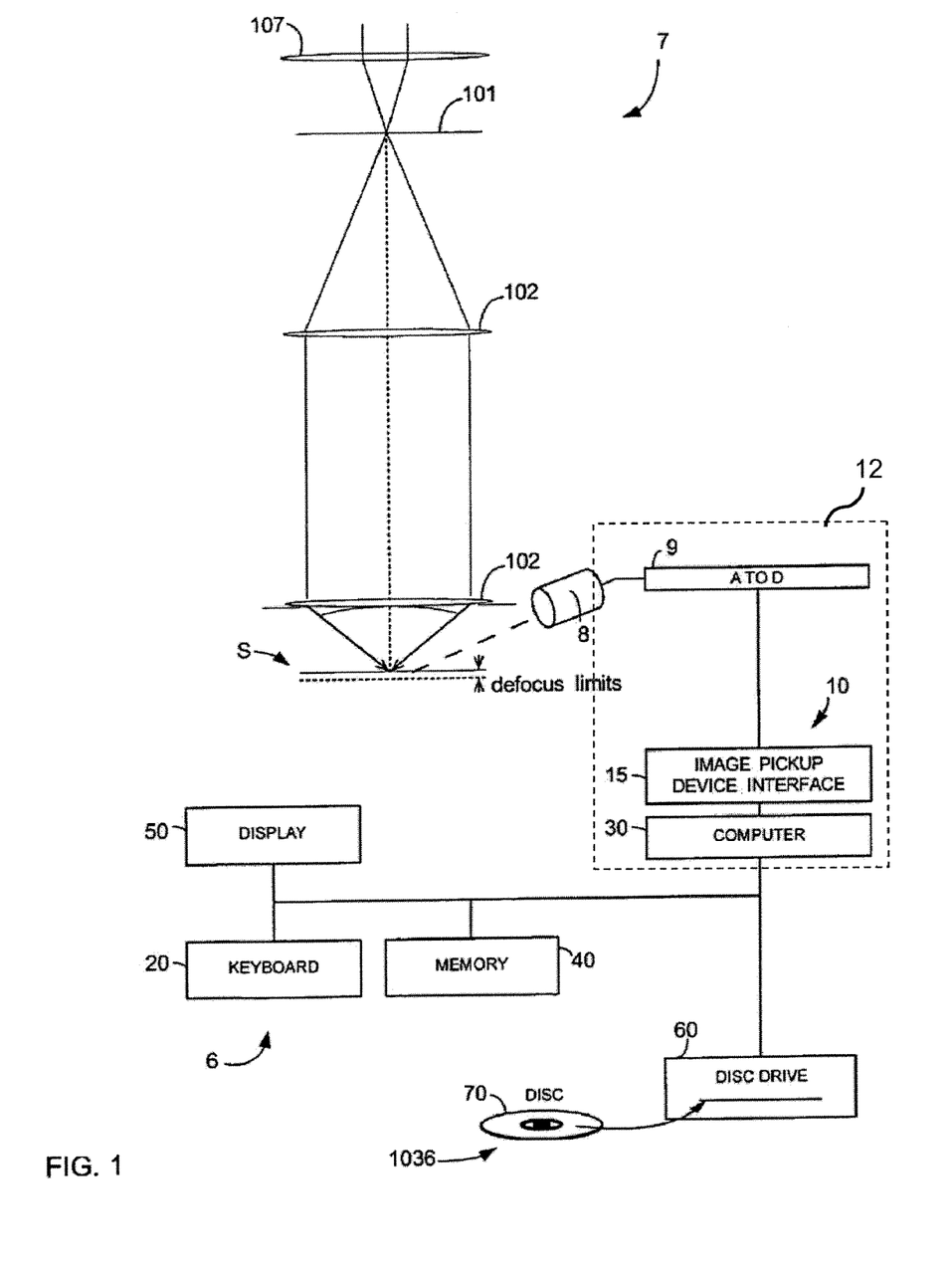
FIG. 1 is a diagrammatic illustration of a microscope enabled computational model verification system, which is constructed in accordance with a preferred embodiment of the present invention.

Referring now to the drawings and more particularly to FIG. 1 thereof, there is illustrated a new and improved computational model verification system 6, which is constructed in accordance with a preferred embodiment of the present invention. More particularly, the system 6 implements a method for calibrating and verifying computational models utilized with optical proximity correction (sometimes referred to herein this specification simply as "OPC"). More specifically, prior to initiating OPC on a proposed integrated circuit layout, a computational model describing the optical, physical and chemical processes involving the lithography is generally obtained. It is important that this computational model be obtained accurately and precisely. To accomplish this task, the computational model is generally calibrated using measurements obtained by running a series of wafers through the same lithography, patterning, and etch processes that are utilized in an actual production for such an integrated circuit. In the preferred embodiment of the present invention, a novel computational model verification method 1036 is described hereinafter in greater detail, which greatly improves the accuracy and precision of the calibrated computational model.

Considering now the computational model verification system 6 in greater detail with reference to FIG. 1, the verification system 6 generally includes a projection optical system 7 and a computer aided design (CAD) system 10 which cooperate with one another to implement or execute several different and unique methods of improving the design phase of an article of manufacture having sub-lightwave structures. In order to allow the projection optical system 7 and the CAD system 10 to cooperate with one another, the verification system 6 further includes an image capture system 12, which couples the optical system 7 and the CAD system 10 together for their cooperation with one another.

In operation, in one preferred embodiment of the present invention, the verification system 6 provides a method of obtaining at least one computational model for optical proximity correction. In another preferred embodiment of the present invention the verification system 6 provides a method of using several already calibrated computational models to predict a best verification structure for all desired dose and defocus settings in the optical system 7. In short, the verification method 1036 allows a user to choose a verified computational model out of several already calibrated models, which were calibrated using calibration structures disposed on the same test mask as the verification structures as will be explained hereinafter in greater detail.

Before describing the preferred embodiments of the present invention in greater detail, it may be beneficial to briefly consider the model based optical proximity correction process. Model-based optical proximity correction (OPC) adjusts photomask data so that the pattern resulting on a wafer is a close replica of a target pattern. An essential element of model-based OPC is a computational model of the patterning process. The computational model describes all or some aspects of optical projection, reactions and diffusion of chemicals in the photoresist, and etching of the wafer. The computational model usually has parameters that need to be determined empirically.

More specifically, the above-mentioned parameters are determined by printing test patterns on wafers using the lithography equipment and processes (such as lithography and etch) that need to be modeled. Critical dimensions of, for example, photoresist and etched wafer patterns, resulting on a test wafer are measured to determine their accuracy. In some situations, various ones of the parameters of the computational model are adjusted until the difference between the predictions of the model and the patterns printed on the wafer are minimized. This process is called "calibration" of the model.

Next, and critically important in model-based OPC, is to verify or determine whether the obtained computational model performs as expected. In this regard, without computational model verification, OPC may not be accurate. Notwithstanding the importance of this aspect of model-based OPC, the prior art described in the following US Patents fail to take model verification into account. The model describing lithography process and exposure tool in the prior art is based on SEM measurements and images of photoresist patterns, and usually for one dose and defocus condition.

Ivanovic, et al., "Automatic Calibration of A Masking Process Simulator," U.S. Pat. No. 6,768,958, issued Jul. 27, 2004.

Ivanovic, et al., "Automatic Calibration of A Masking Process Simulator," U.S. patent application Ser. No. 10/829,408, Apr. 20, 2004.

Garza, et al., "Comparing Aerial Image to SEM of Photoresist or Substrate Pattern for Masking Process Characterization," U.S. Pat. No. 6,078,738, issued Jun. 20, 2000.

Laidig, et al., "Method of Two Dimensional Feature Model Calibration and Optimization," U.S. patent application Ser. No.10/266,922, filed Oct. 9, 2002.

Garza, et al., "Comparing Aerial Image To Actual Photoresist Pattern for Masking Process Characterization," U.S. Pat. No. 6,081,659, issued Jun. 27, 2000.

Considering now the computational model verification system 6 in greater detail with reference to FIG. 1, the optical system or imaging system 7 as illustrated is for projection lithography. In this regard, the system 6, when in use, utilizes a test mask (reticle) 101, and a pair of lenses 102 to cause an image to be formed on a substrate S as best seen in FIG. 1. In order to detect the sub lightwave structures formed on the substrate S, the system 6 further includes an image pickup device or microscope 8, such as a scanning electronic microscope (SEM), an analog to digital converter 9 and an image pickup device interface unit 15, all of which form part of the image capture system 12. As the operation and construction of such electronic items are well known to those skilled in the art, details of their operation and structure will not be provided.

Considering now the CAD system 10 in greater detail, the CAD system 10 generally includes a computer 30 which is coupled to a set of input/output devices such as a keyboard 20, a random access memory 40, a display 50 and a disc drive 60. The disc drive 60 is capable of reading a computer usable medium or program product, such as a DVD disc 70 as well as recording, on a DVD disc, any information that would assist a user of the system. As will be described hereinafter in greater detail, the disc 70 has encoded thereon computer readable code, which causes the computer 30 to execute or implement the novel verification method 1036.

Considering now the computational model verification system 6 in still greater detail, the computational model verification system 6, unlike the prior art of calibrating OPC models, utilizes a verification step on separate structures besides the ones used for calibrating the models. In this regard, the computational models are calibrated using critical dimension scanning electronic microscope measurements, otherwise known as CD-SEM measurements. The CD-SEM measurements are taken for a set of printed predetermined structures with multiple defocus and dose conditions, i.e. using focus exposure matrix (FEM). These printed patterns/structures can have photoresist patterns and etch wafer patterns. Generally, depending on the inversion problem, it is very common to have more than one solution for the model that fits the CD-SEM measurements in "least square" sense. In this case, the choosing of a best model, which predicts verification structures (generally a critical part of final product layout) for desired process latitude (i.e. dose and defocus values), requires an additional step. In the instant case, the verification method 1036 uses verification structures which are disposed on the same test mask as the calibration structures to qualify a model for OPC.

As will be shown in greater detail, verifying the computational model is implemented by scanning the SEM images taken on the verification patterns (either photoresist or etched wafer) for given process latitude (i.e. for different dose and defocus conditions). This process as described results in an accurate and precise computational model.

Figure 3:
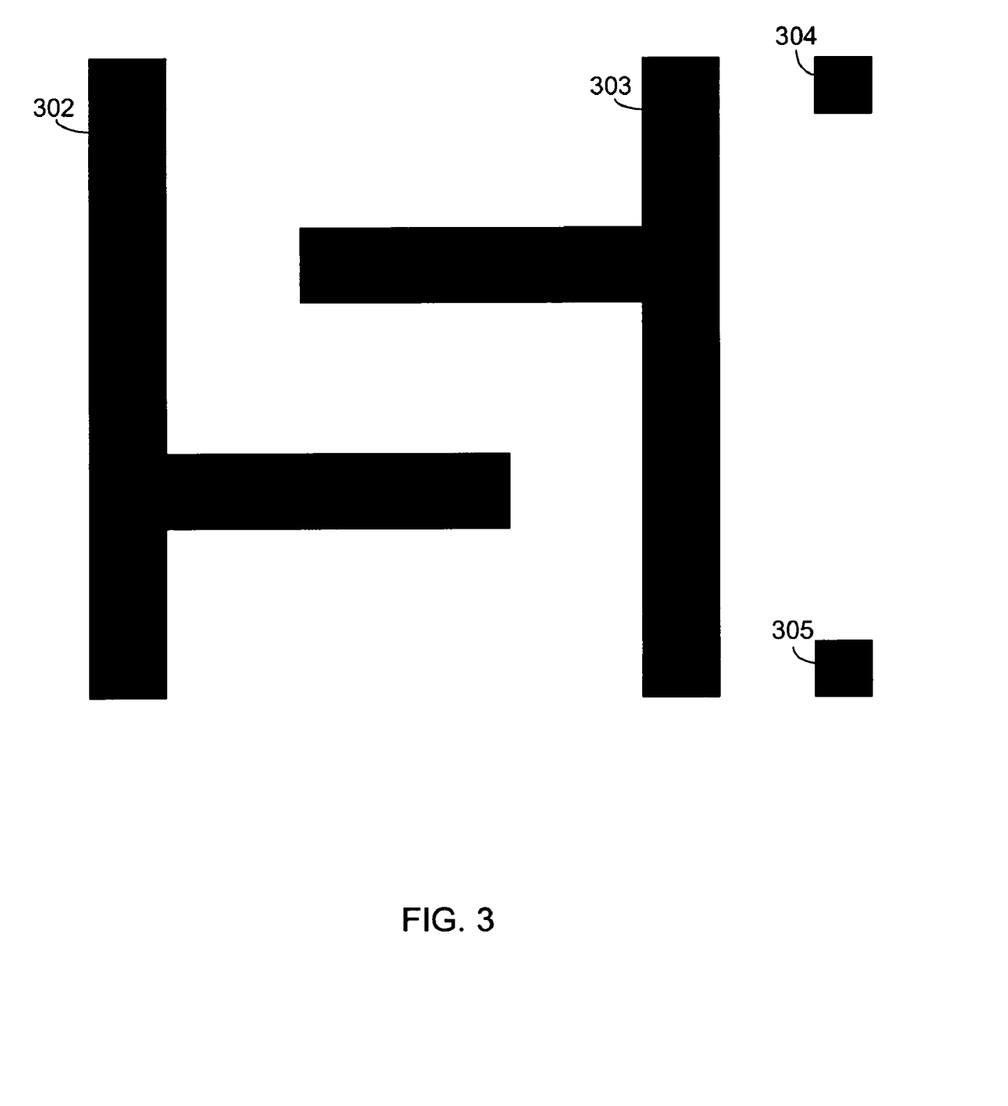
FIG. 3 is a detected scanning electronic microscope image of a pattern and model predicted edge for the same design feature.
Figure 8:
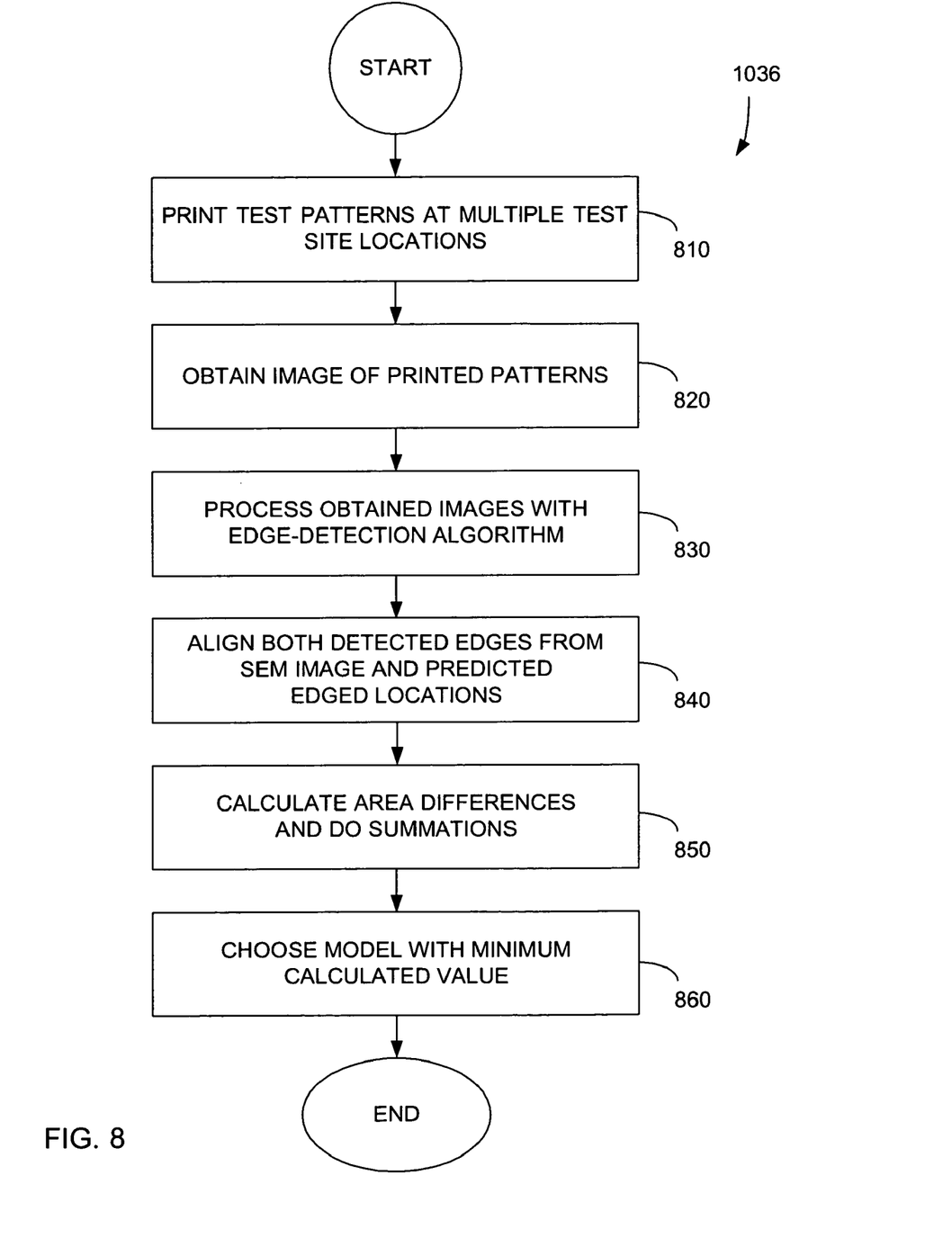
FIG. 8 is a flow diagram of a computational model verification method, which method is in accordance with another preferred embodiment of the present invention.

Considering now the verification method 1036 in greater detail with reference to FIG. 8, the verification method 1036 comprises the following steps:

In a printing or forming step 810, test patterns 302, 303, 304 and 305 respectively, as best seen in FIG. 3, are printed or formed at multiple sites on a wafer and with different dose and defocus conditions. It should be understood by those skilled in the art, that the formed test pattern images may be detected by other means as well. For example, the images may be detected by an image sensor if so desired.

Next, at a scanning step 820, using a scanning electronic microscope, such as the microscope 8 as best seen in FIG. 1, SEM images of the printed patterns are obtained at multiple sites and with different dose and defocus conditions. It should also be understood that images of the printed patterns may be obtained by alternative means, such as by atomic-force microscopy (AFM), scanning-tunneling microscopy (STM), or transmission electron microscopy (TEM). Therefore, there is no intention of limiting the scope of the present invention to using only a scanning electronic microscope to obtain such pattern images.

Figure 4A:
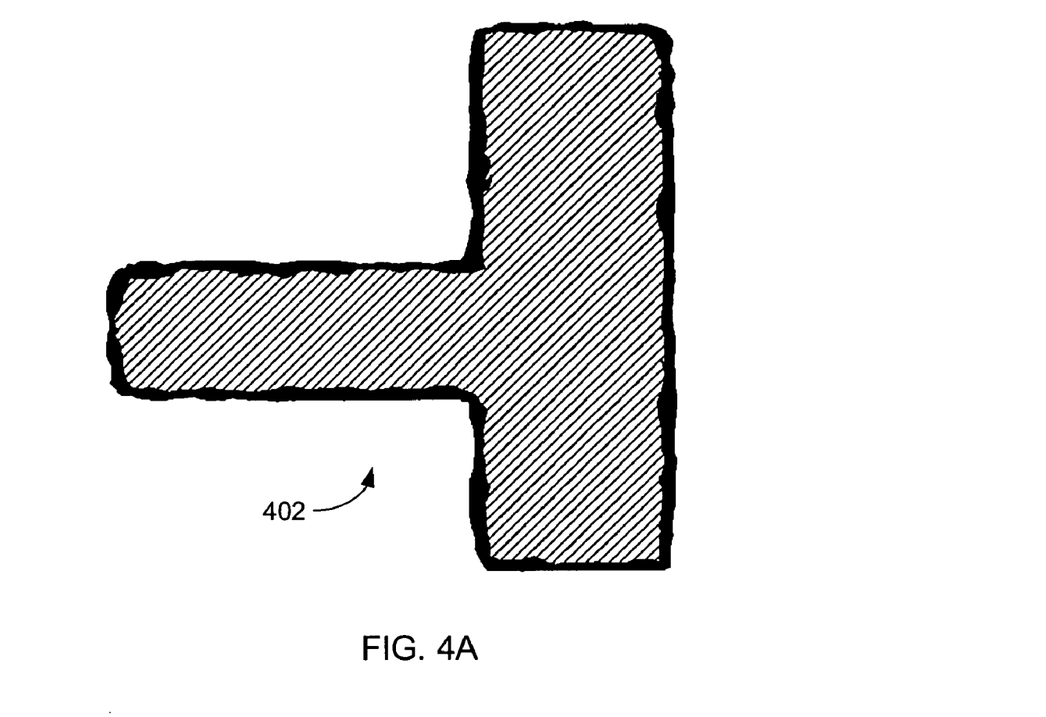
FIGS. 4A-C illustrate different stages of edge detection for scanning electronic microscope images of a photoresist pattern including an original image, a de-noised image, an edge detection image.
Figure 4B:
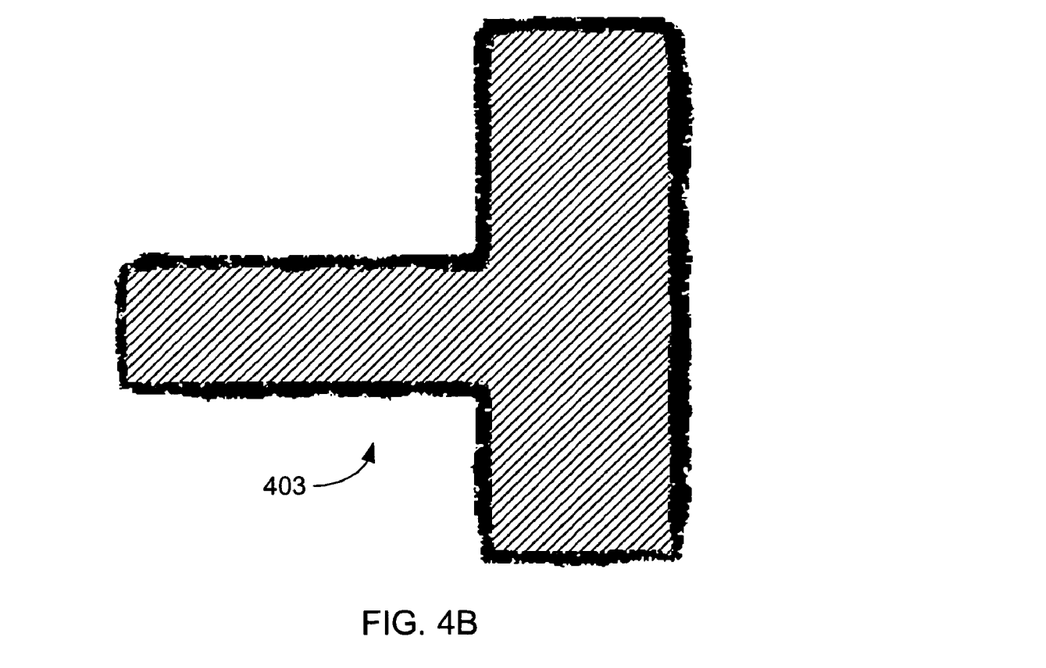
Figure 4C:
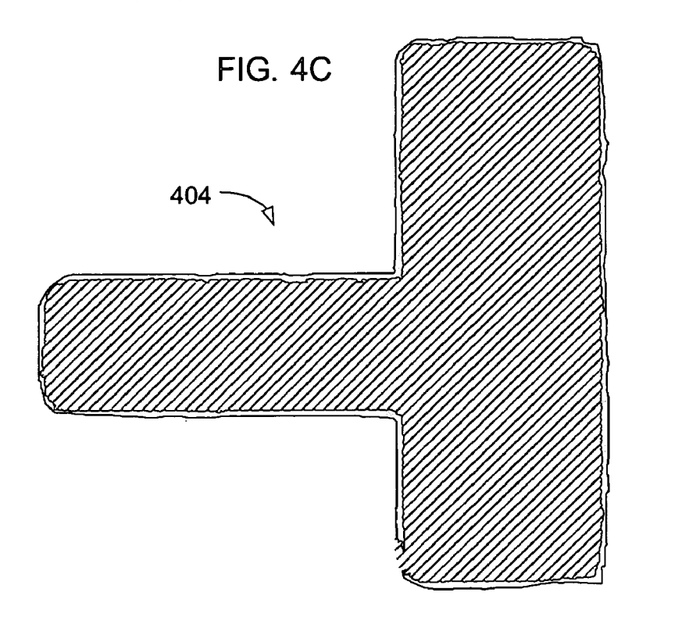
Figure 4D:
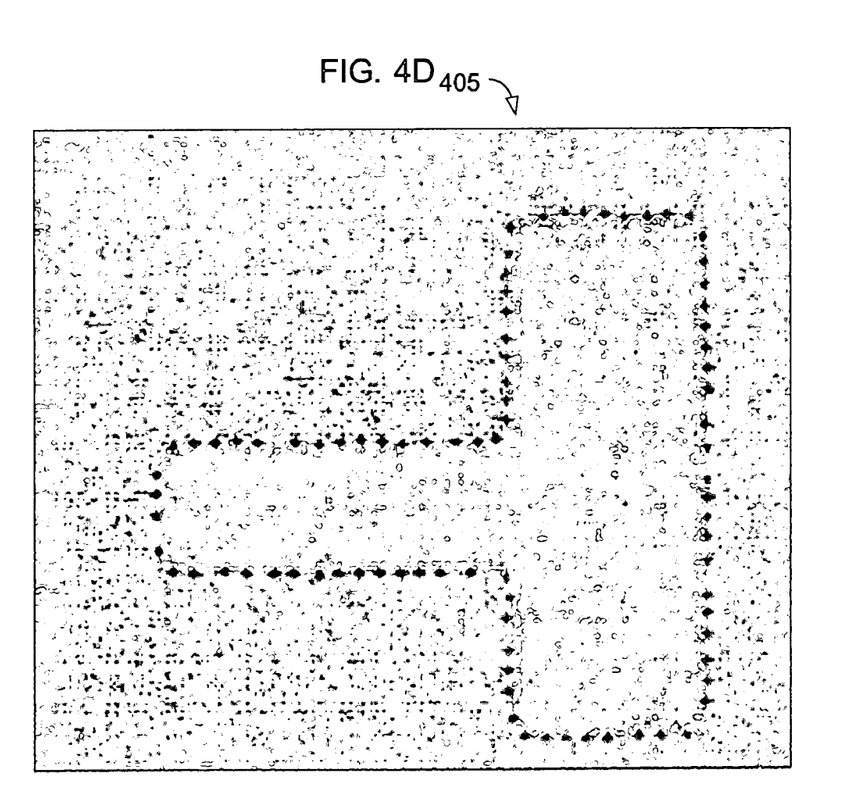
FIG. 4D is a photo taken from a scanning electronic microscope showing an edge contour image.

Next, at a processing step 830, the SEM images are processed with an edge-detection algorithm to provide edge contours, such as those contours illustrated in FIG. 4D for example. As edge-detection algorithms are well known to those skilled in the art, the edge-detection algorithm will not be described in greater detail. However, if a reader is interested in obtaining a better understanding of such an algorithm, reference may be made to an article by R. C. Gonzales and R. E. Woods, entitled "Digital Image Processing", published by Addison-Wesley Publishing Company, 1992, at pages 416-429, which article is incorporated herein by reference as though fully set forth.

Figure 5:
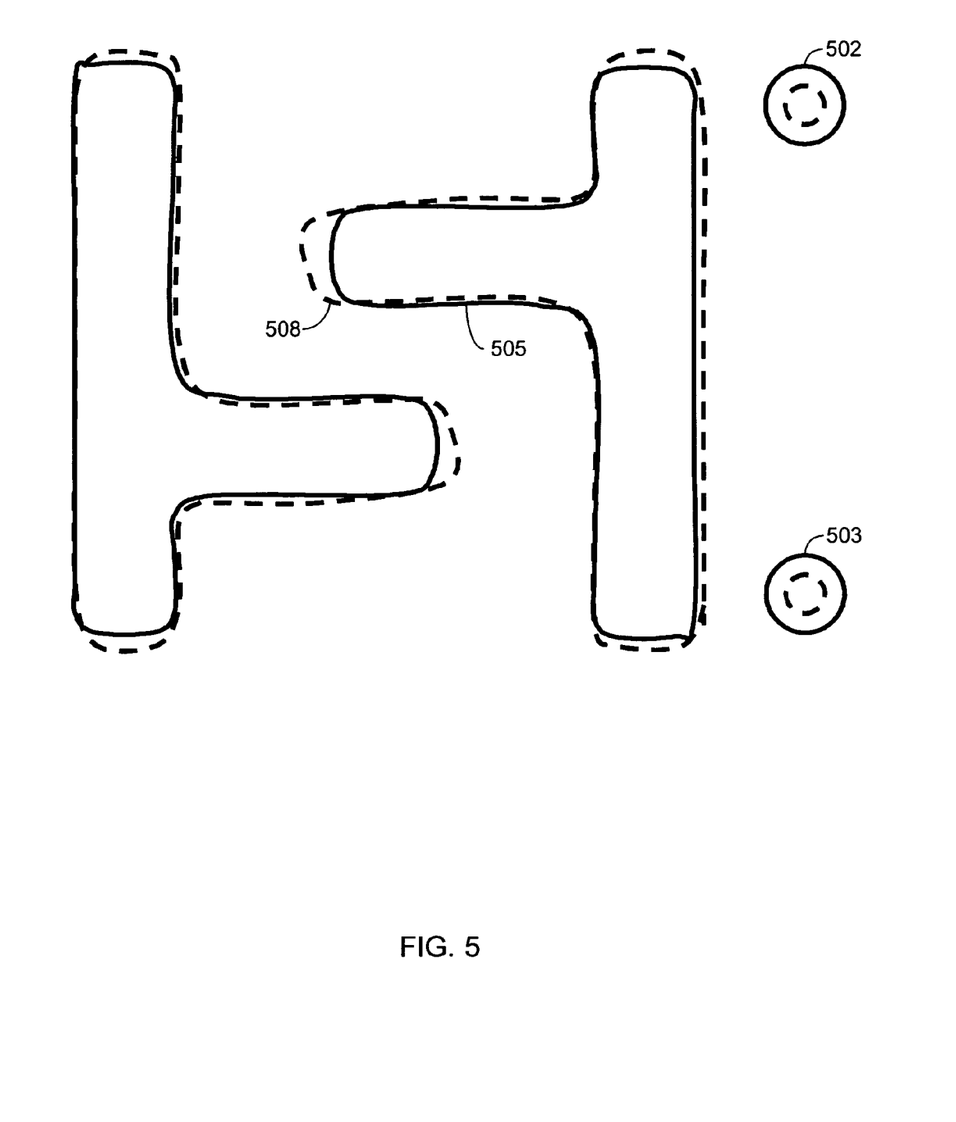
FIG. 5 is a detected edge of the scanning electronic microscope image for a pattern and model predicted edge for the same design feature.

Next, at an alignment step 840, using alignment patterns, such as alignment patterns 502 and 503 as best seen in FIG. 5, the SEM image detected edge 505 and the model predicted edge 508 are aligned. If a reader is interested in obtaining a better understanding of such an algorithm, reference may be made to an article by R. C. Gonzales and R. E. Woods, entitled "Digital Image Processing", published by Addison-Wesley Publishing Company, 1992, at pages 571-658, which article is incorporated herein by reference as though fully set forth.

Figure 6:
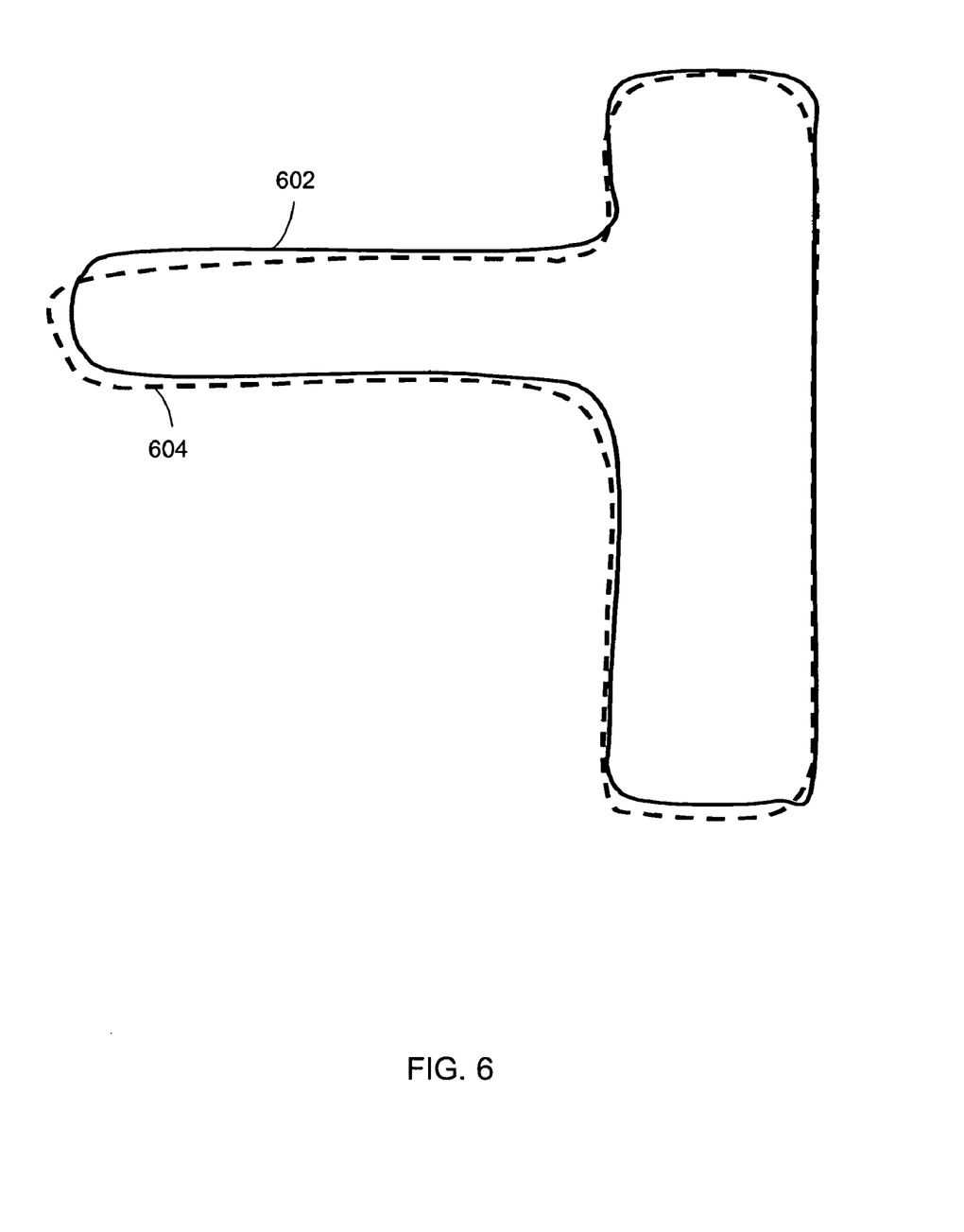
FIG. 6 illustrates the difference between scanning electronic microscope image edge and a simulated edge for the pattern.

Next, at a calculation step 850, an area difference between two edge location contours, indicated generally at 602 and 604 respectively (FIG. 6), is calculated and summed for all dose and defocus exposure conditions (FEM).

Finally, at another calculate step 860, the computational model that has the minimum value number calculated at step 5, is chosen for the verification structures used.

Considering the verification method 1036 in still greater detail, it should be noted that verification structures are printed (either photoresist pattern or etch wafer pattern) on the substrate S at combination of dose and defocus conditions to form a focus exposure matrix, known as a FEM. Preferably, these verification structures are the critical part of the final product layout. Moreover, both calibration structures and verification structures are on the same test mask and exposed using same process settings. The calibration structures are the structures for which CD-SEM measurements are obtained and the computational models for OPC are calibrated using these measurements.

SEM images (or alternatively AFM, STM, TEM) of verifications structures printed are taken. These images are usually noisy. A de-noising algorithm is applied to these images to highlight the location of the edges. For example, FIG. 4A illustrates a detected image 402 of a SEM image of the pattern and model predicted edge for the same design feature before applying such a de-noising algorithm, while FIG. 4B illustrates a de-noised image 404 after the algorithm has been applied.

Typically, de-noising can be accomplished using methods like minimum total variance algorithm, Perona-Malik diffusion (non-linear scalar diffusion), Gaussian derivatives, non-local means, and any combination of these methods. For example, consider the following non-linear diffusion scheme as a de-noising method:

$$\partial_t L = \nabla \cdot (c(\|\nabla L\|)\nabla L)$$

where c is a scalar function dependent on the gradient norm $\|\nabla L\|$.

Perona and Malik were the first to introduce non-linear diffusion within the image-processing context and, in this regard, they introduced conductivity functions, that will now be considered relative to the de-noising process:

$$c(\|\nabla L\|) = \exp\left(\frac{\|\nabla L\|^2}{k^2}\right)$$

Furthermore, the quality of these images can be increased by taking multiple images, such as SEM of the same pattern; however, taking the SEM image of photoresist pattern multiple times may heat the photoresist and cause the pattern dimensions to change. But, taking multiple SEM images of the same etched pattern will not have this problem. In this regard, in the preferred method 1036, the step of obtaining an image of the FEM is repeated a sufficient number of times to improve the quality of the acquired image, but is not repeated such a sufficient number of times to heat the test surface to a sufficient temperature to cause test surface degradation.

In the describe de-noising process, it will be understood by those skilled in the art, that multiple images can be averaged to decrease the noise and highlight the edge location. Edge detection can be done thresholding the gradient of the de-noised image. Moreover, it can be also done by thresholding the maximum of the eigenvalues of the Hessian matrix of the de-noised image. Alternatively, it can also be done by thresholding the minimum of the eigenvalues of the Hessian matrix of the de-noised image.

With this short hand notation a 2nd order Taylor expansion of the image L can be expressed as:

$$L(x+y, s) = L + x^T \nabla L + \frac{1}{2} x^T H_L x$$

where $\nabla L$ is the gradient of the image function:

$$\nabla L = \begin{pmatrix} L_x \\ L_y \end{pmatrix}$$

and $H_L$ is the Hessian matrix:

$$H_L = \begin{pmatrix} L_{xx} & L_{xy} \\ L_{xy} & L_{yy} \end{pmatrix}$$

Figure 7:
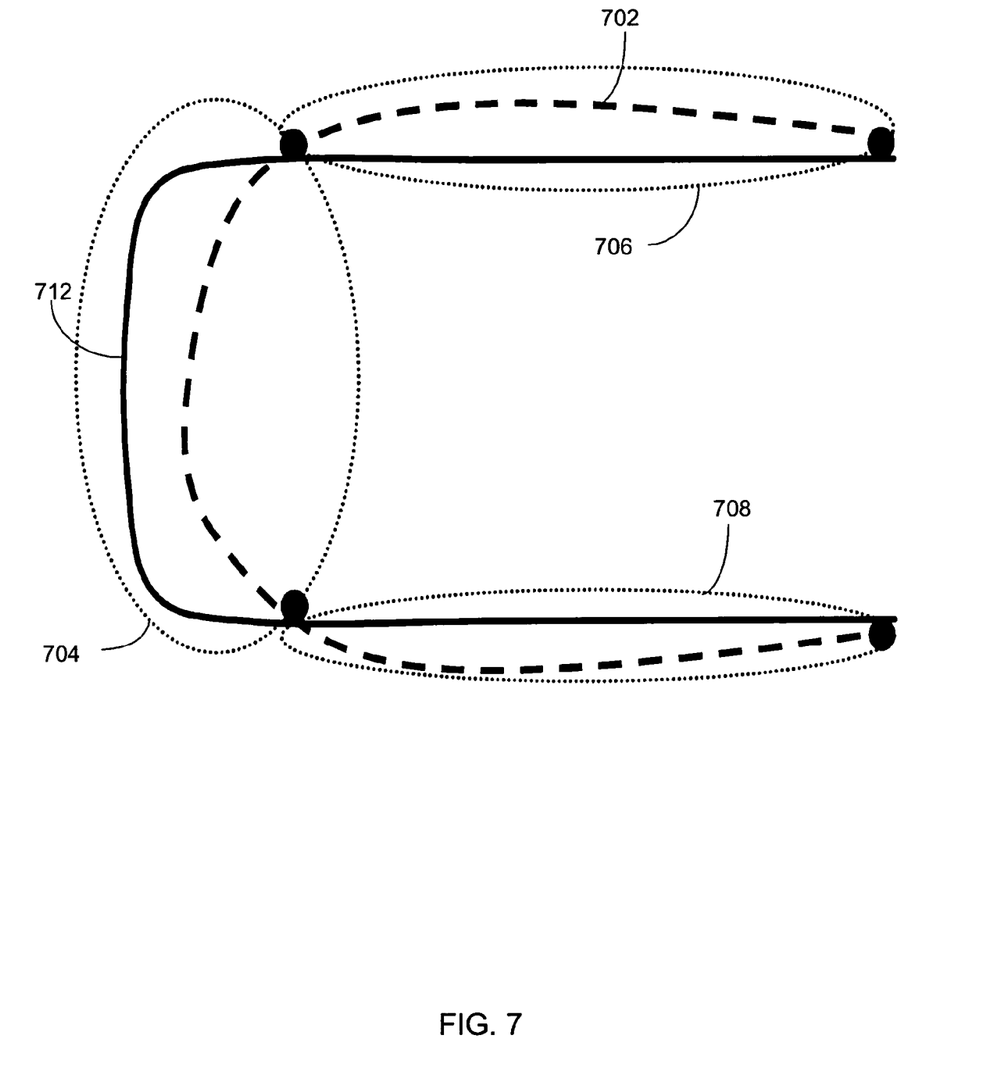
FIG. 7 illustrates the difference between the scanning electronic microscope image edge and the simulated edge for the pattern, where different contours define the area difference between the scanning electronic microscope image edge and a model predicted edge.

After edge detection of the image is completed (for example, edge detection of an image 404 as best seen in FIG. 4C) and edge contour describing the edge is obtained (for example, edge contour of an image 405 as best seen in FIG. 4D), the model predicted edge for the same verification pattern is calculated using the calibrated models. Generally, depending on the model parameter choice, there are more than single calibrated model. The method we are describing here is choosing the best model that described the verification structure for the specific focus-exposure matrix (FEM). Thus, for each model and each FEM condition, a separate model predicted edge contour is calculated. For example, in FIG. 7, three model predicted edge contours are illustrated for a model predicted edge 702: a first contour 704, a second contour 706 and a third contour 708. In this regard, FIG. 7 illustrates the difference between a scanned electronic microscope image edge 712 and the simulated edge for the pattern. Contours 704, 706 and 708 define the difference between the SEM image edge and the model predicted edge 702. Later, for each model predicted, a contour area difference from the printed pattern edge as shown in FIG. 7 is calculated using the following equation and summed for all FEM conditions for the specific calibrated model:

$$\text{Area} = \frac{1}{2} \sum_{\substack{All \\ Contours}} \oint_{Contour_N} x\,dy - y\,dx$$

The area amount calculated using the equation above is a goodness factor for choosing the calibrated OPC model for the specific verification structure.

Instead of calculating the area difference as a goodness factor, the following alternative embodiments are acceptable: In a first alternative embodiment, the non-overlapping pixels for the areas enclosed with these contours are calculated; and in a second alternative embodiment, the normals between two contours is calculated. Furthermore, edge detection on the images captured by SEM, AFM, STM, TEM, etc., can be directly convolved with the model predicted images instead of using edge detection.

Considering now the computer program product 70, in greater detail with reference to FIGS. 1 and 8, the computer program product 70 is a computer usable medium that has encoded thereon computer readable codes. The computer readable codes enable a user, via the CAD system 10, to cause a computational model to be selected from one of several different already calibrated models to predict a best verification structure for all desired dose and defocus setting in a focus exposure matrix. The user is also enabled to finalize a model out of the several different already calibrated models, which were calibrated using calibration structures that are also disposed on the same test mask as the verification structures. This is a unique and novel approach not previously considered which improves the accuracy and precision of the calibrated model. In this regard, the computer program product 70 has encoded thereon computer readable program code that causes the computer 30 to obtain and verify at least one computational model for optical proximity correction purposes.

More particularly, the computer readable program code encoded on the disc 70 causes the computer 30 to generate a test mask pattern having a plurality of verification structures and a plurality of calibration structures and then to generate a plurality of calibrated computational modes using the plurality of calibration structures. After the various computation models are calibrated, the code further causes the computer 30 to choose and verify a best computational model using the plurality of verification structures and individual ones of the plurality of computational models.

Figure 2:
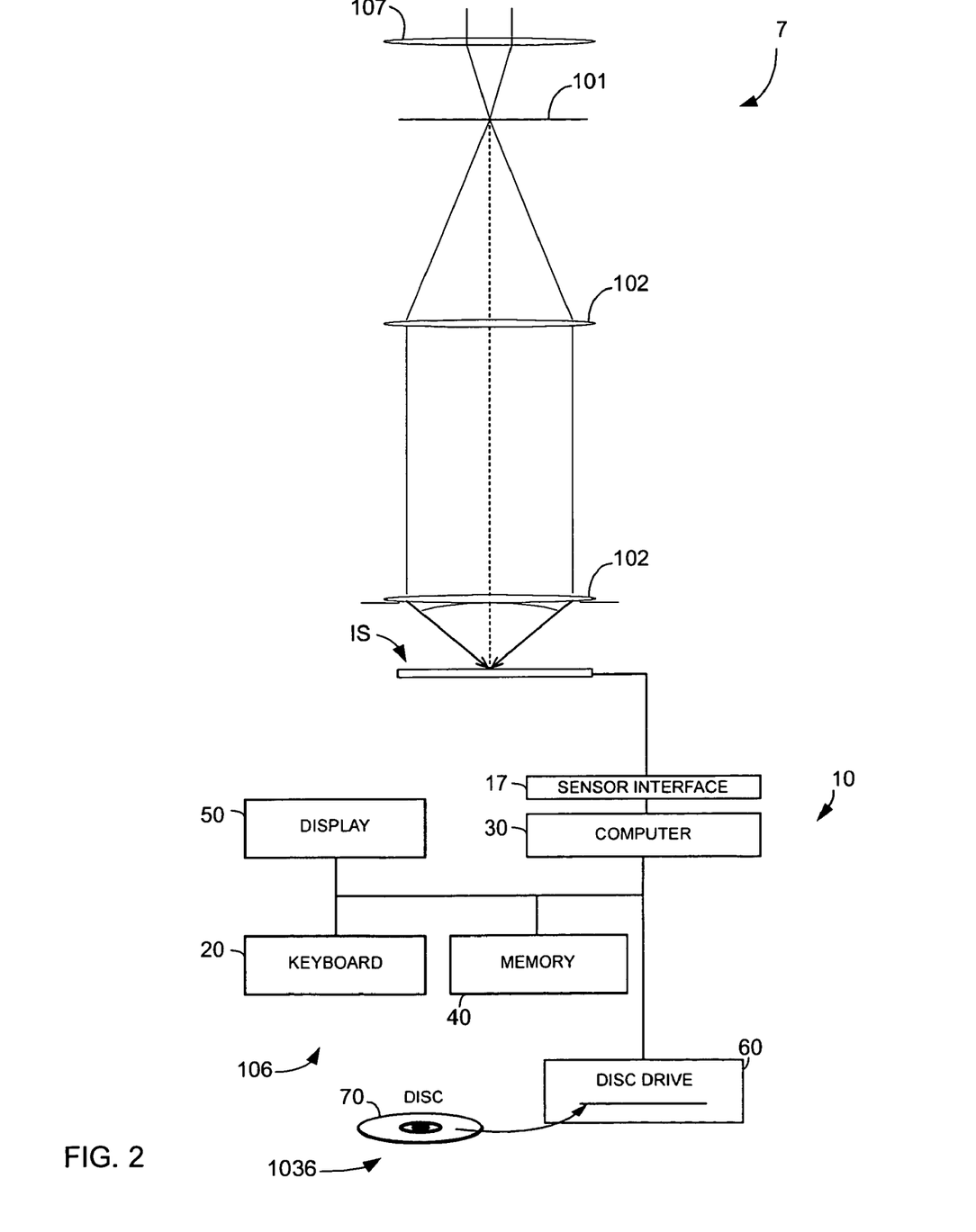
FIG. 2 is a diagrammatic illustration of an image sensor enabled computational model system, which is constructed in accordance with another preferred embodiment of the present invention.

Referring now to the drawings and more particularly to FIG. 2 thereof, there is illustrated an image sensor enabled computational model verification system 106 which is constructed in accordance with another preferred embodiment of the present invention. The image sensor enabled computational model verification system 106 is identical to system 6 except that the projection optical system 7 and the CAD system 10 are coupled together by sensor interface 17 and an image sensor array IS for aerial image measurements. Brion Technologies, Inc. manufactures for example, an image sensor array under the tradename of Aerion™, which would be suitable for helping to implement the present invention. As the operation and construction of such electronic items are well known to those skilled in the art, details of their operation and structure will not be provided.

In the preferred embodiment, the computer readable code has been described as being encoded on a disc 70 that can be entered into the computer memory 40 by the disc drive 60, which reads and transfers the code under computer control. However, it is contemplated that the code could be entered directly from the keyboard 20 or any other input device that is capable of communication with the computer 30. Therefore, while a particular embodiment of the present invention has been disclosed, it is to be understood that various different modifications are possible and are contemplated within the true spirit and scope of the appended claims. There is no intention, therefore, of limitations to the exact abstract or disclosure herein presented.

We claim:

1. A method for selecting from optical proximity correction models, comprising:
   receiving a data set that represents a verification structure formed on a mask;
   receiving a measured geometric characteristic of a verification pattern formed from the verification structure;
   applying a plurality of computational models for optical proximity correction to the data set to predict a corresponding plurality of modeled geometric characteristics;
   comparing the measured geometric characteristic to the plurality of modeled geometric characteristics;
   selecting a computational model for optical proximity correction from among the plurality of computational models for optical proximity correction based on the comparisons between the measured geometric characteristic and the plurality of modeled geometric characteristics; and
   providing the selected computational models for optical proximity correction.

2. The process of claim 1, further comprising:
   receiving a second measurement that corresponds to a characteristic of a calibration pattern formed from a calibration structure;
   forming the plurality of computation models for optical proximity correction from the second measurement.

3. The process of claim 2, wherein the verification structure and the calibration structure are formed on a single mask and the calibration pattern and the verification pattern are formed on a surface of a single substrate.

4. The process of claim 3, wherein the calibration pattern and the verification pattern are formed by exposing the mask a sufficient number of times to create a focus exposure matrix on the substrate.

5. The process of claim 4, wherein an image of the focus exposure matrix is obtained to form the first and second measurements.

6. The process of claim 5, wherein the step of forming the measurements includes applying a de-noising algorithm to the patterns to facilitate pattern edge location.

7. The process of claim 6, wherein the step of obtaining the image of the focus exposure matrix is repeated a sufficient number of times to improve a quality of acquired images, but not such a sufficient number of times to heat the test surface to a sufficient temperature to cause the surface to degrade.

8. The process of claim 7, wherein the obtained images are averaged to decrease noise and to emphasize edge patterns.

9. The process of claim 8, wherein the step of forming the measurements includes applying an edge-detection algorithm to detect verification structure edges.

10. The process of claim 9, wherein the edge-detection algorithm includes thresholding a gradient of a of de-noised image.

11. The process of claim 9, wherein the edge-detection algorithm includes thresholding maximum eigenvalues of a Hessian matrix of a de-noised image.

12. The process of claim 9, wherein the edge-detection algorithm includes thresholding minimum eigenvalues of a Hessian matrix of a de-noised image.

13. The process of claim 9, wherein the step of applying includes detecting an edge contour to describe an obtained verification structure edge.

14. The process of claim 9, further comprising calculating a separate model predicted edge for each computational model and for each verification structure and for each condition in said focus exposure matrix.

15. The process of claim 14, wherein the comparing step includes obtaining a goodness factor to aid in the selecting step.

16. The process of claim 1, wherein the comparing step further comprises calculating contour areas of the measurement and modeled verification structures.

17. The process of claim 16, wherein the comparing step further comprises applying a an area difference comparison of the contour areas.

18. The process of claim 16, wherein the comparing step further comprises comparing the normals of the contour areas.

19. The process of claim 16, wherein the step of comparing further comprises calculating the non-overlapping pixels for the contour areas.

20. A selecting apparatus, comprising:
   a means for receiving a data set that represents a verification structure formed on a mask;
   a means for receiving a measured geometric characteristic of a verification pattern formed from the verification structure;
   a means for applying a plurality of computational models for optical proximity correction to the data set to predict a corresponding plurality of modeled geometric characteristics;
   a means for comparing the measured geometric characteristic to the plurality of modeled geometric characteristics;
   a means for selecting a computational model for optical proximity correction from among the plurality of computational models for optical proximity correction based on the comparisons between the measured geometric characteristic and the plurality of modeled geometric characteristics; and
   a means for providing the selected computational models for optical proximity correction.

21. A computer program product for selecting from optical proximity correction models, comprising:
   a computer usable medium having computer readable program code embodied in said medium for causing a computational model for computing optical proximity correction to be selected, said computer program product having: A selecting apparatus, comprising:
   computer readable program code for receiving a data set that represents a verification structure formed on a mask;
   computer readable program code for receiving a measured geometric characteristic of a verification pattern formed from the verification structure;
   computer readable program code for applying a plurality of computational models for optical proximity correction to the data set to predict a corresponding plurality of modeled geometric characteristics;
   computer readable program code for comparing the measured geometric characteristic to the plurality of modeled geometric characteristics;
   computer readable program code for selecting a computational model for optical proximity correction from among the plurality of computational models for optical proximity correction based on the comparisons between the measured geometric characteristic and the plurality of modeled geometric characteristics; and
   computer readable program code for providing the selected computational models for optical proximity correction.

* * * * *